United States Patent
Choi

(10) Patent No.: US 11,516,914 B2
(45) Date of Patent: Nov. 29, 2022

(54) PRINTED CIRCUIT BOARD

(71) Applicant: SAMSUNG ELECTRO-MECHANICS CO., LTD., Suwon-si (KR)

(72) Inventor: Seong Ho Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 25 days.

(21) Appl. No.: 17/103,034

(22) Filed: Nov. 24, 2020

(65) Prior Publication Data
US 2022/0095453 A1   Mar. 24, 2022

(30) Foreign Application Priority Data

Sep. 18, 2020   (KR) .................. 10-2020-0120820

(51) Int. Cl.
*H05K 1/11* (2006.01)
*H05K 1/02* (2006.01)
*H05K 3/40* (2006.01)

(52) U.S. Cl.
CPC ............. *H05K 1/11* (2013.01); *H05K 3/4007* (2013.01); *H05K 1/0266* (2013.01); *H05K 1/111* (2013.01); *H05K 2201/0939* (2013.01); *H05K 2201/09409* (2013.01); *H05K 2203/072* (2013.01)

(58) Field of Classification Search
CPC .............. H05K 1/11; H05K 3/4007; H05K 2201/0939; H05K 2201/09409; H05K 2203/072
See application file for complete search history.

(56) References Cited

U.S. PATENT DOCUMENTS

| | | | |
|---|---|---|---|
| 6,380,059 B1* | 4/2002 | Ho | H05K 1/0293 438/599 |
| 2002/0157958 A1* | 10/2002 | Kikuchi | H01L 23/528 204/279 |
| 2003/0150110 A1* | 8/2003 | Kang | H05K 3/242 29/830 |
| 2005/0247481 A1* | 11/2005 | Chen | H05K 1/0269 174/262 |
| 2006/0027393 A1* | 2/2006 | Aonuma | H05K 3/242 174/250 |
| 2012/0087099 A1 | 4/2012 | Moon et al. | |

FOREIGN PATENT DOCUMENTS

| | | |
|---|---|---|
| JP | 5666366 B2 | 2/2015 |
| KR | 10-1064754 B1 | 9/2011 |
| KR | 10-2012-0036446 A | 4/2012 |
| KR | 10-1499281 B1 | 3/2015 |

* cited by examiner

*Primary Examiner* — Ishwarbhai B Patel
(74) *Attorney, Agent, or Firm* — Morgan, Lewis & Bockius LLP

(57) ABSTRACT

A printed circuit board includes: a base substrate including a unit region; a plurality of connection pads disposed on one surface of the base substrate; and first and second lead-in lines disposed on the one surface and respectively connected to at least a portion of the plurality of connection pads. The first and second lead-in lines have first and second cut surfaces on the one surface, respectively. The first cut surface is disposed in a position spaced apart from a side surface of the printed circuit board. The second cut surface is exposed to the side surface of the printed circuit board.

20 Claims, 23 Drawing Sheets

PRINTED CIRCUIT BOARD

CROSS-REFERENCE TO RELATED APPLICATION(S)

This application claims benefit of priority to Korean Patent Application No. 10-2020-0120820 filed on Sep. 18, 2020 in the Korean Intellectual Property Office, the disclosure of which is incorporated herein by reference in its entirety.

TECHNICAL FIELD

The present disclosure relates to a printed circuit board, for example, a printed circuit board provided with a plated lead-in line having a cut surface.

BACKGROUND

When a solder ball for connecting a printed circuit board and other components is mounted on a printed circuit board, a flow of electrical charges may occur due to static electricity generated by a contact between a metal mask and a substrate, generating a potential difference between the solder ball disposed on an outermost side of one surface of the printed circuit board and a fiducial mark having a "+" shape in the adjacent dummy region, and a ball-shift phenomenon occurs due to the potential difference when the solder ball is mounted, so that a substrate design is required to prevent the same.

SUMMARY

An aspect of the present disclosure is to provide a printed circuit board capable of eliminating static electricity by preventing generation of a potential difference between a unit substrate region and a dummy region.

An aspect of the present disclosure is to provide a printed circuit board that does not generate a potential difference by electrically connecting a solder ball disposed on an outermost portion of a unit substrate to a fiducial mark.

An aspect of the present disclosure is to provide a printed circuit board including a plated lead-in line having a cut surface formed through etchback etching.

One of the various solutions proposed in the present disclosure is to implement a printed circuit board by introducing a plated lead-in line connecting a solder ball disposed on an outermost portion of a unit substrate and a fiducial mark, and suppressing the occurrence of a potential difference between the two to prevent a solder ball-shift phenomenon.

For example, according to an aspect of the present disclosure, a printed circuit board includes: abase substrate; a plurality of connection pads disposed on one surface of the base substrate; and first and second lead-in lines disposed on the one surface and respectively connected to at least a portion of the plurality of connection pads. The first and second lead-in lines have first and second cut surfaces on the one surface, respectively. The first cut surface is disposed in a position spaced apart from a side surface of the printed circuit board. The second cut surface is exposed to the side surface of the printed circuit board.

For example, according to an aspect of the present disclosure, a printed circuit board includes: abase substrate; a plurality of connection pads disposed on one surface of the base substrate; and a lead-in line having a cut surface exposed from a side surface of the printed circuit board. A connection pad disposed at a shortest distance from a corner of the one surface of the base substrate among the plurality of connection pads may be connected to the lead-in line.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
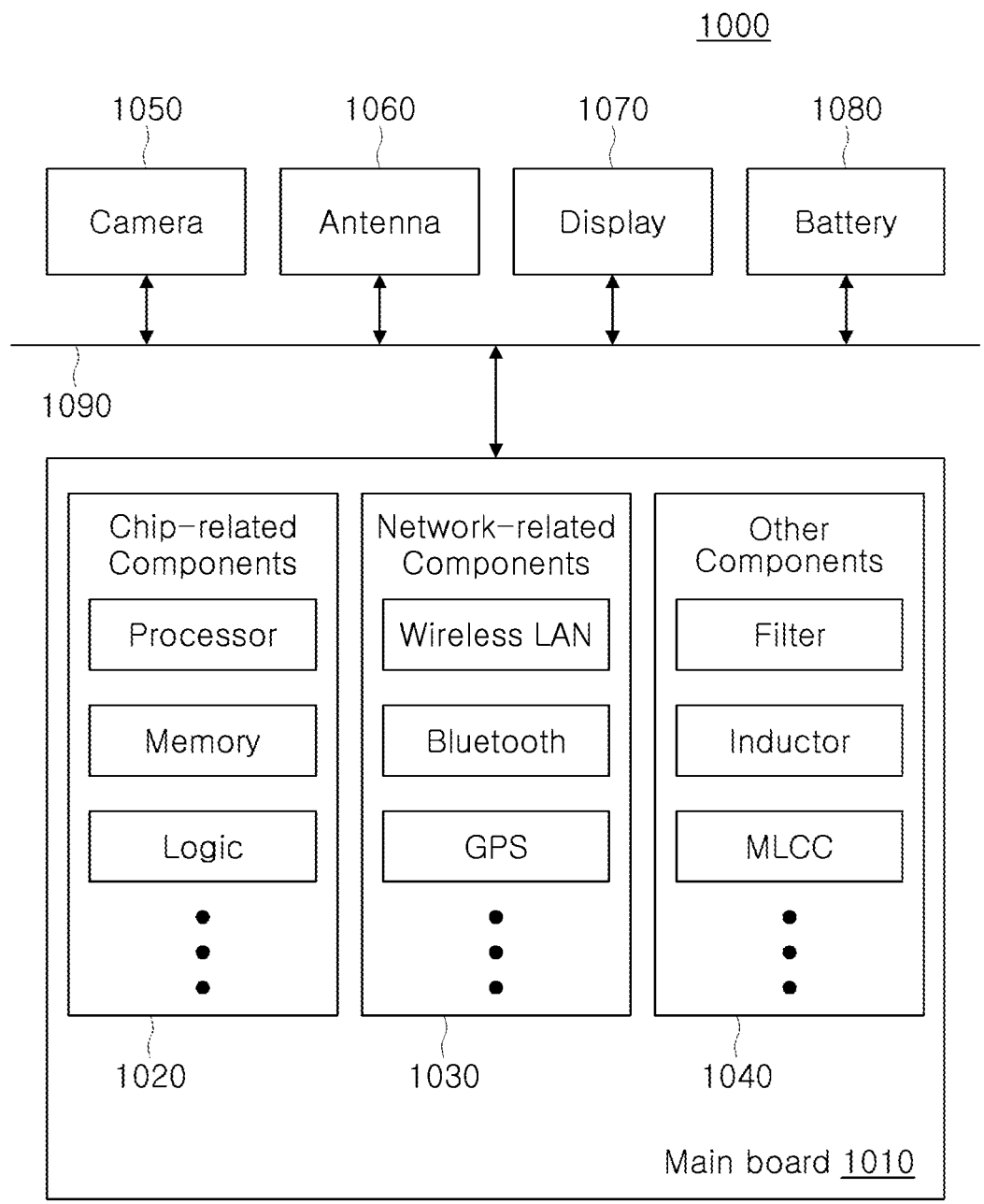
FIG. 1 is a block diagram schematically illustrating an example of an electronic device system.

Hereinafter, the present disclosure will be described with reference to the accompanying drawings. Shapes and dimensions of the elements in the drawings may be exaggerated or reduced for greater clarity of description.

FIG. 1 is a schematic block diagram illustrating an example of an electronic device system.

Referring to FIG. 1, an electronic device 1000 may accommodate a motherboard 1010. The motherboard 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an m analog-to-digital converter, an application-specific integrated circuit (ASIC), or the like, or the like. However, the chip-related components 1020 are not limited thereto, and may include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), amass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
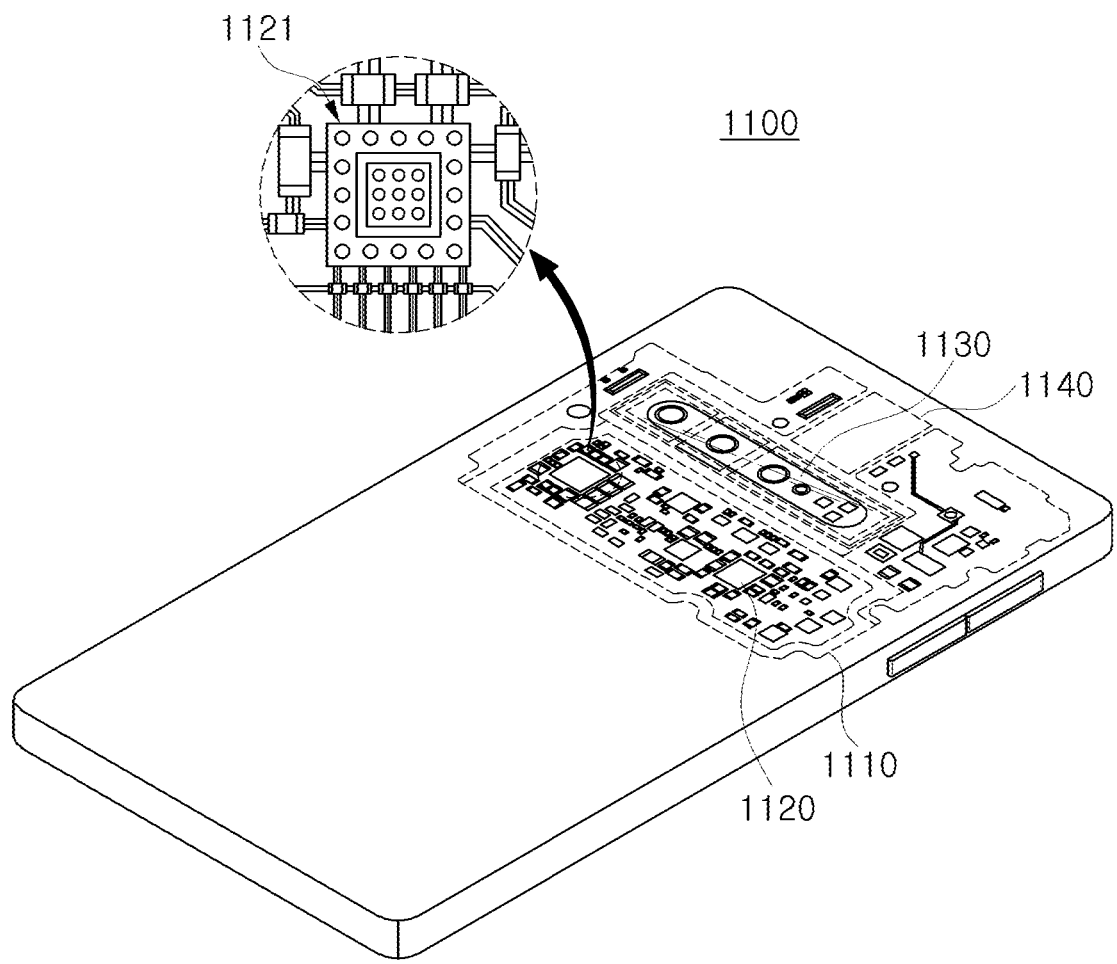
FIG. 2 is a plan view schematically illustrating an example of an electronic device.

FIG. 2 is a plan view illustrating an example of an electronic device.

Referring to FIG. 2, an electronic device may be, for example, a smartphone 1100. The mainboard 1110 may be accommodated in the smartphone 1100, and various electronic components 1120 may be physically and/or electrically connected to the mainboard 1110. In addition, other electronic components, such as a camera package 1130 and/or a speaker 1140 may be accommodated therein. A portion of the electronic components 1120 may be the above-described chip related components, for example, a component package 1121, but are not limited thereto. The component package 1121 may be one in which a plurality of electronic components are disposed on a multilayer printed circuit board in a form of surface mounting, but is not limited thereto. The electronic device is not necessarily limited to the smartphone 1100, and may be other electronic devices as described above.

Figure 3:
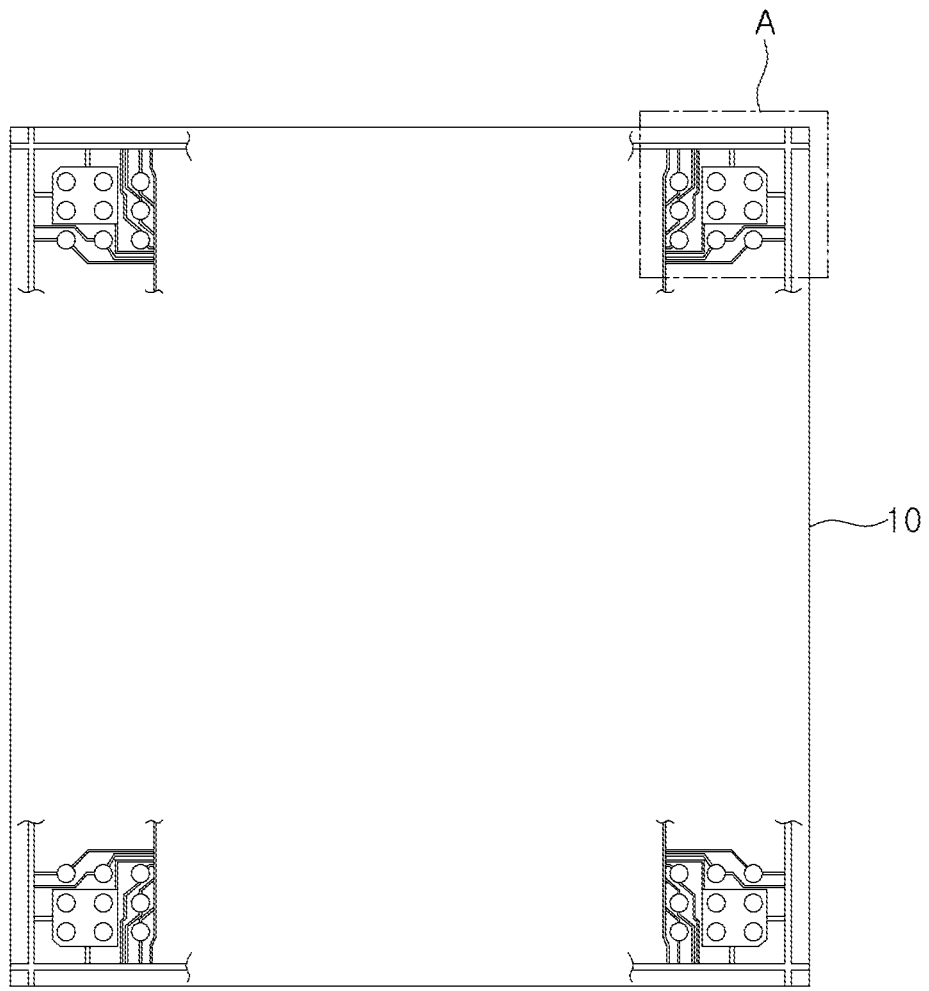
FIG. 3 is a plan view schematically illustrating an example of a strip substrate, showing one unit region and an adjacent dummy region among the printed circuit boards in strip units.

FIG. 3 is a plan view showing an example of a strip substrate, showing one unit region and an adjacent dummy region among printed circuit boards in strip unit.

Strip substrates 900A and 900B (to be described below) include a base substrate 10, the base substrate 10 may include a plurality of unit regions U (to be described later) and a plurality of dummy regions D (to be described later) formed around the unit regions U, and the unit region U and the dummy region D may be separated through a dicing or sawing process.

In the present disclosure, among the base substrates 10, an outermost region of the unit region U, a solder ball 130 (to be described later) disposed in a corner region thereamong, and lead-in lines 110 and 120 (to be described later) adjacent thereto, have a main characteristic configuration, so that FIG. 3 mainly illustrates a corner region of the unit region U, and other configurations that may be included are omitted, and in the omitted region, a configuration that can be disposed above a conventional printed circuit board may be disposed. For example, a solder ball (not shown), an electronic component disposed above the solder ball, or the like may be disposed.

Region A of FIG. 3 represents one of four corner of one surface 11 of the base substrate 10, and FIGS. 4 to 22 below illustrate the present disclosure in an enlarged state of the region A. Therefore, the configuration and technical characteristics illustrated in FIGS. 4 to 22 may also be equally applied to the corners of one surface 11 of the base substrate 10 in three other locations.

FIGS. 4 to 22 disclose a transmittance view, a plan view, or a cutaway plan view of the present disclosure based on region A of FIG. 3.

Figure 4:
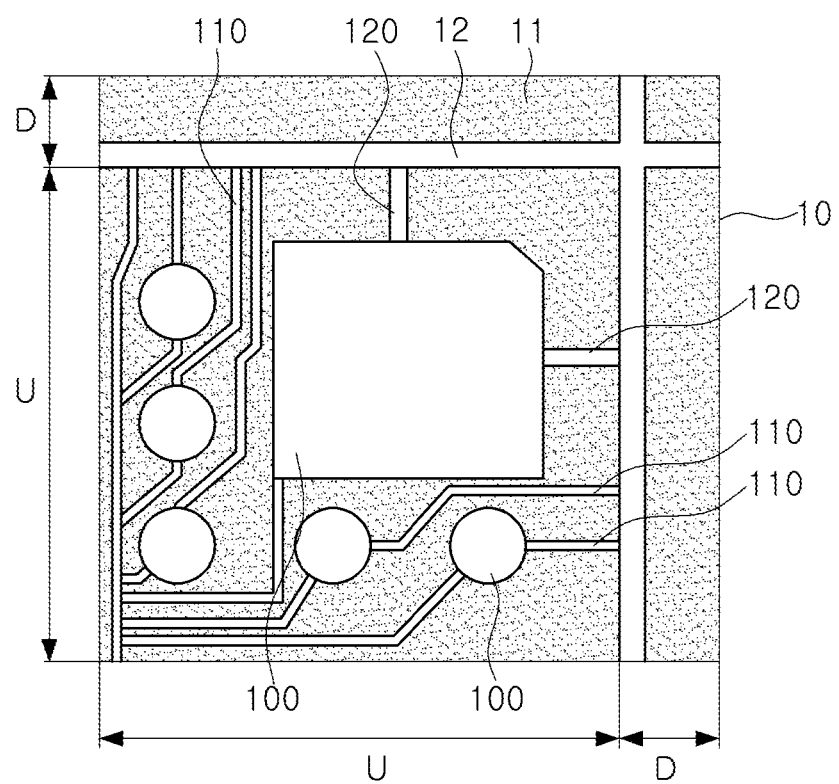
FIG. 4 is an enlarged view illustrating enlarged region A of FIG. 3 in the strip substrate according to a first embodiment of the present disclosure.

FIG. 4 is an enlarged view showing an enlarged region A of FIG. 3 in the strip substrate according to a first embodiment of the present disclosure.

Referring to FIG. 4, a strip substrate 900A includes a base substrate 10. A plurality of connection pads 100 are disposed on one surface 11 on a unit region U of the base substrate 10. The base substrate 10 may include a plurality of insulating layers and/or a plurality of circuit layers, and the insulating layer may include an insulating material or an insulating resin, and if a material is generally used as an insulating material in a printed circuit board. However, the present disclosure is not limited thereto. For example, a thermosetting resin such as an epoxy resin, a thermoplastic resin such as polyimide, or a resin impregnated with a reinforcing material such as glass fiber or an inorganic filler may be used. In addition, it may be formed of resins such as prepreg, Ajinomoto Build-up Film (ABF), FR-4, Bismaleimide Triazine (BT), and the like. The circuit layer of the base substrate 10 may include a metal material, and any metal material having excellent electrical conductivity, generally used as a circuit layer, is not particularly limited. As the metal material, copper (Cu), aluminum (Al), silver (Ag), tin (Sn), gold (Au), nickel (Ni), lead (Pb), titanium (Ti), or alloys thereof may be included.

The connection pad 100 may also include a metal material, and any metal material having excellent electrical conductivity may be used, without being limited thereto. As the metal material, copper (Cu), aluminum (Al), silver (Ag), tin (Sn), gold (Au), nickel (Ni), lead (Pb), titanium (Ti), or alloys thereof may be included.

The connection pad 100 may be disposed on one surface 11 of the base substrate 10, and after a metal layer 90 is disposed, the metal layer 90 may be a layer patterned according to the design or use, and as a patterning method, any method as long as it is a conventional patterning method, such as exposure, development, etching or the like, may be used without limitation. For example, the connection pad 100 may be formed by a plating process such as an additive process (AP), a semi AP (SAP), a modified SAP (MSAP), tenting (TT), or the like, and as a result, may include a seed layer, an electroless plating layer, and an electrolytic plating layer formed based on the seed layer, respectively. As the electrolytic plating layer, a gold plating layer 101 to be described later may be further disposed.

In a patterning process of the metal layer 90, not only the connection pad 100 but also lead-in lines 110 and 120 are patterned. The lead-in line may be divided into a first lead-in m line 110 and a second lead-in line 120, and the first lead-in line 110 may function as a plating lead-in line for gold plating to the connection pad 100 and an outer wiring 12 inside a fiducial mark 20 to be described later, and the second lead-in line 120 is a lead-in line for connecting the fiducial mark 20 and the solder ball 130 to prevent a potential difference between the fiducial mark 20 and the solder ball 130 to be described later.

The first and second lead-in lines 110 and 120 may be connected to the connection pad 100, respectively, and may be connected through the outer wiring 12 on an insulating member 30. The outer wiring 12 may be disposed in a dummy region D on one surface of the base substrate 10 to surround the unit region U, and may be formed by being patterned together during the patterning process of the connection pad 100, like the lead-in line. A fiducial mark 20, to be described later, may be orthogonal at the position adjacent to the corner of one surface 11 of the base substrate 10, and may be formed in a region in which the outer wiring 12 is orthogonal.

As described above, the first lead-in line 110 functions as a plating lead-in line for the electrolytic gold plating process of the outer wiring 12 or the connection pad 100. The first lead-in line 110 may serve as a passage for electrical connection during electroplating.

The second lead-in line 120 is disposed to contact the connection pad 100 disposed at the shortest distance from each corner of the unit region U on one surface 11 of the base substrate 10 as disclosed in FIG. 4. As described above, the second lead-in line 120 is not a lead-in line for plating, but corresponds to a lead-in line for preventing the occurrence of a potential difference between the solder ball 130 and the connection pad 100 and the fiducial mark 20 to be described later. In this case, an opposite end of the second lead-in line 120 is connected to an outer wiring 12, and the outer wiring 12 is disposed to intersect at a position adjacent to the corner of the unit region U of the dummy region D, to form the fiducial mark 20 to be described later.

In this manner, the outer wiring 12 of the fiducial mark 20 and the connection pad 100 disposed at the shortest distance from each corner of the unit region U are electrically connected, so that the occurrence of a potential difference between the fiducial mark 20, the connection pad disposed at the shortest distance from each corner of the unit region U, and the solder balls 130 disposed above the connection pad 100 to be described later, is suppressed. Accordingly, the printed circuit board according to the present disclosure can achieve an effect of preventing a solder ball-shift phenomenon, which was previously a problem due to the occurrence of a potential difference.

Figure 5:
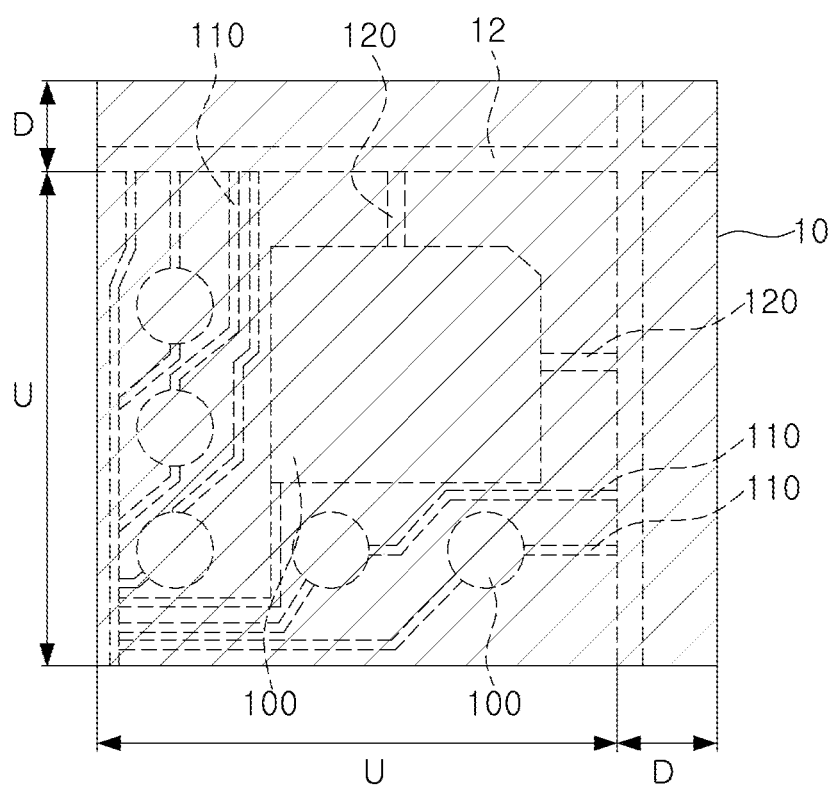
FIG. 5 is a transmittance view of a structure in which a solder resist layer is applied to the strip substrate of FIG. 4.

FIG. 5 is a transmittance view of a structure in which a solder resist layer is applied to the strip substrate of FIG. 4.

A solder resist layer 200 may be applied on one surface 11 of the base substrate 10 of FIG. 4. The solder resist layer 200 may be disposed on one surface 11 to protect the connection pad 100, and the first and second lead-in lines 110 and 120. The solder resist layer 200 may be made of a photosensitive material. In addition, the solder resist layer 200 may have thermal curing and/or photocuring properties.

Figure 6:
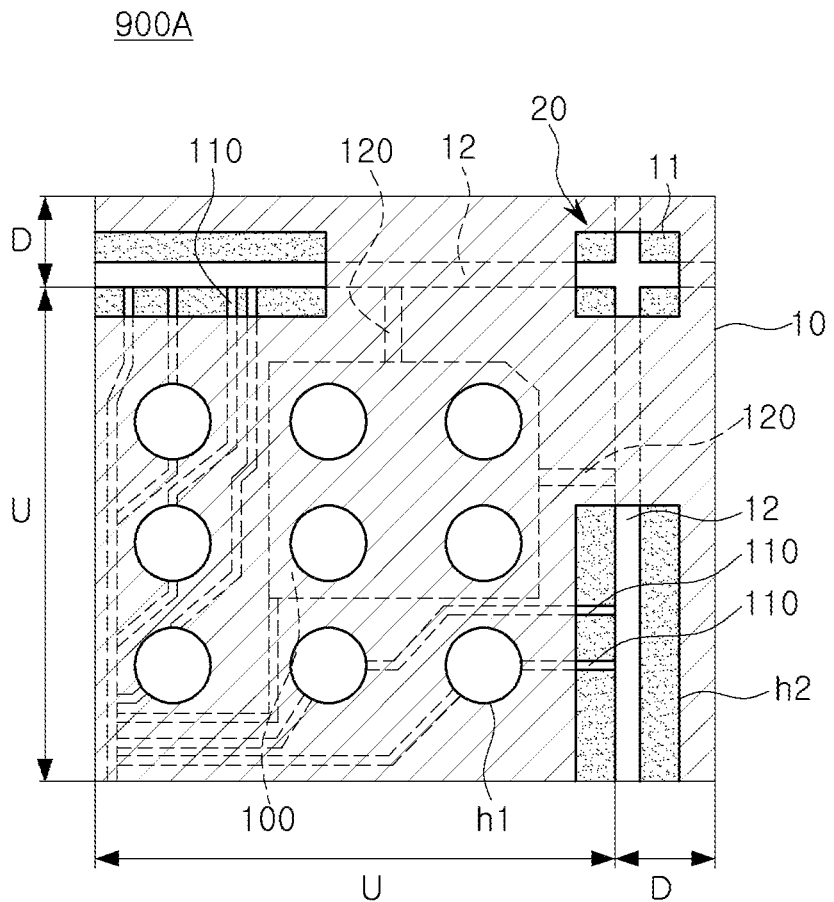
FIG. 6 is a transmittance view of a structure in which a partial region of the solder resist layer of FIG. 4 is developed.
Figure 7:
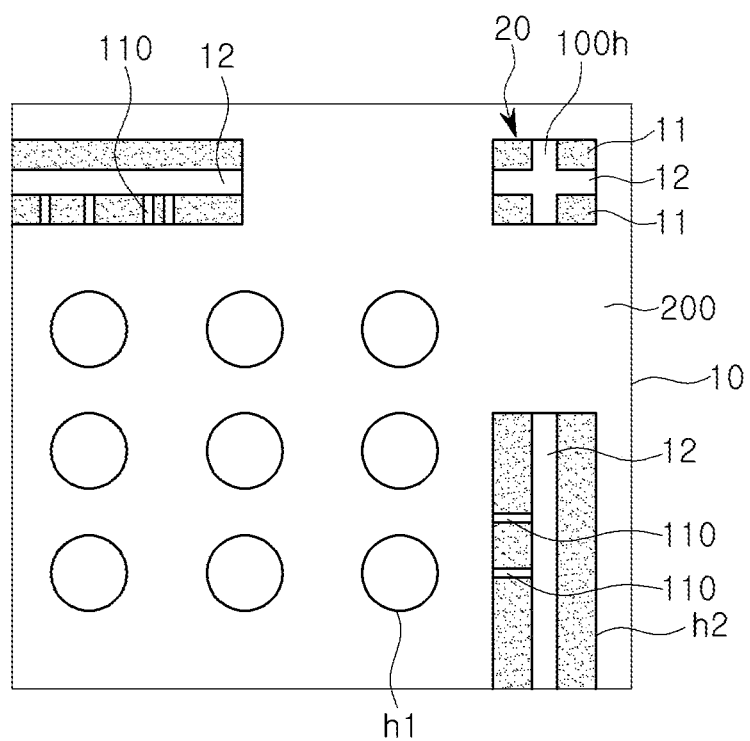
FIG. 7 is a plan view of a structure in which a partial region of the solder resist layer of FIG. 4 is developed.

FIGS. 6 and 7 are transmittance and plan views of a structure in which a partial region of the solder resist layer of FIG. 4 is developed, respectively.

As disclosed in FIGS. 6 and 7, a partial region of the solder resist layer 200 may be removed, so that an internal configuration thereof may be exposed externally.

As a method for removing the solder resist layer 200, any method of removing an insulating material such as an exposure/development process or an etching process may be used without limitation. As disclosed in FIG. 7, in addition to the region in which the solder resist layer 200 is applied, a first opening h1 exposing at least one region of the connection pad 100, a second opening h2 exposing the first lead-in line 110 and the outer wiring 12, and a fiducial mark 20 may be formed to be exposed externally of the solder resist layer 200.

In addition, in a process of removing a portion of the solder resist layer 200, a partial region of the outer wiring 12 and a portion of the first lead-in line 110 may be exposed, and the above-described fiducial mark 20 is formed in a region intersecting in a form in which the outer wiring 12 is orthogonal.

The fiducial mark 20 is disposed in a dummy region D on one surface 11 of the base substrate 10, is disposed in a region, adjacent to the corner of the unit region U among the dummy regions D, and refers to a region including the outer wiring 12 and the base substrate 10.

The fiducial mark 20, when separating the substrate of each unit region U through a cutting process such as dicing, in the strip substrate 900A including a plurality of unit substrates called the unit region U, serves to provide a reference point of the dicing line, and is basically plated with a metal material such as copper to be easily recognized by the facility, and in some cases, it can be more easily facilitate being recognized through gold plating.

In the case of FIGS. 6 and 7, the fiducial mark 20 disposed on the dummy region D corresponding to one region of the four corners of the unit region U is shown, but the fiducial mark 20 may also be formed in the corresponding dummy region D like in other three corners.

Figure 8:
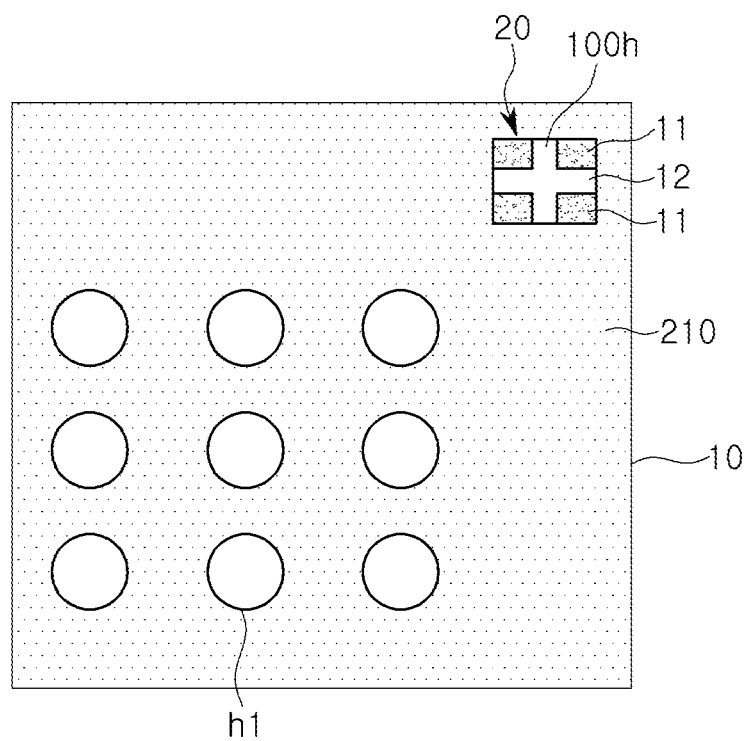
FIG. 8 is a plan view of a structure in which a mask is applied to the strip substrate of FIG. 7.
Figure 9:
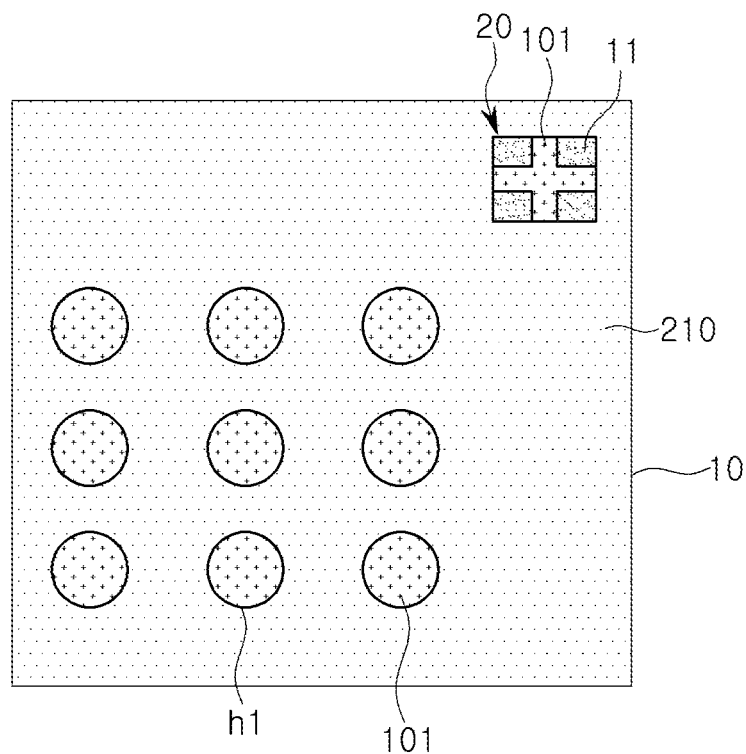
FIG. 9 is a plan view of a structure in which a gold plating layer is disposed on the strip substrate on which the mask of FIG. 8 is disposed.

FIG. 8 is a plan view of a structure in which a mask is applied to the strip substrate of FIG. 7, and FIG. 9 is a plan view of a structure in which a gold plating layer is disposed on the strip substrate on which the mask of FIG. 8 is disposed.

Referring to FIG. 8, a structure in which a mask 210 is applied to a strip substrate 900A of FIG. 7 is disclosed. The mask 210 is applied on the entire surface of the one surface 11 of the base substrate 10, but may cover a region excluding the fiducial mark 20 and the first opening h1 of the connection pad 100. This is to distinguish a gold plating region in a process of placing the gold plating layer disclosed in FIG. 9.

As disclosed in FIG. 9, a region not covered by the mask 210 may be subjected to gold plating. Therefore, among exposed regions, a connection pad 100 of the first opening h1 except for the area of the base substrate 10, an insulating material, and an upper surface of the outer wiring 12 inside the fiducial mark 20 are gold plated, respectively, so that a gold plating layer 101 may be disposed. In the gold plating process, a gold plating process is performed by electroplating through the first lead-in line 110. The connection pad 100 that does not directly contact the first lead-in line 110 in the cut plan view of FIG. 4 is also electrically connected to the connection pad 100 connected to the other first lead-in line 110, and a gold plating layer 101 may be disposed.

The above-described electroplating process of placing the gold plating layer 101 may be omitted from the process as necessary, and the gold plating layer 101 may not be disposed on the connection pad 100 or the outer wiring 12.

The gold plating layer 101 makes it possible to more easily facilitate identification of the outer wiring 12 of the fiducial mark 20 to easily facilitate a dicing line in a dicing process of the strip substrate 900A, and is also disposed on an upper surface of the connection pad 100, and may serve to facilitate identification of a region in which the solder ball 130, which will be described later, will be disposed. Of course, it is also obvious that it can improve signal transmission due to the characteristics of gold (Au) having high conductivity.

Figure 10:
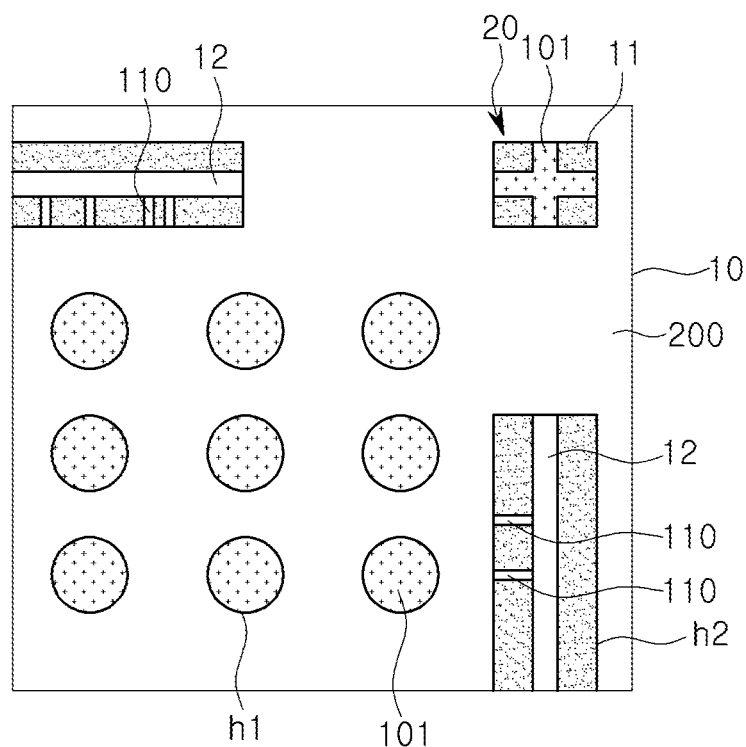
FIG. 10 is a plan view of a structure in which a mask is removed from the strip substrate of FIG. 9.

FIG. 10 is a plan view of a structure in which a mask is removed from the strip substrate of FIG. 9.

As disclosed in FIG. 10, a plan view of the base substrate 10 after the mask 210 is removed discloses an exposed outer wiring 12, a first lead-in line 110, a connection pad including a gold plating layer 101, and a region of the fiducial mark 20 including the gold plating layer 101.

Figure 11:
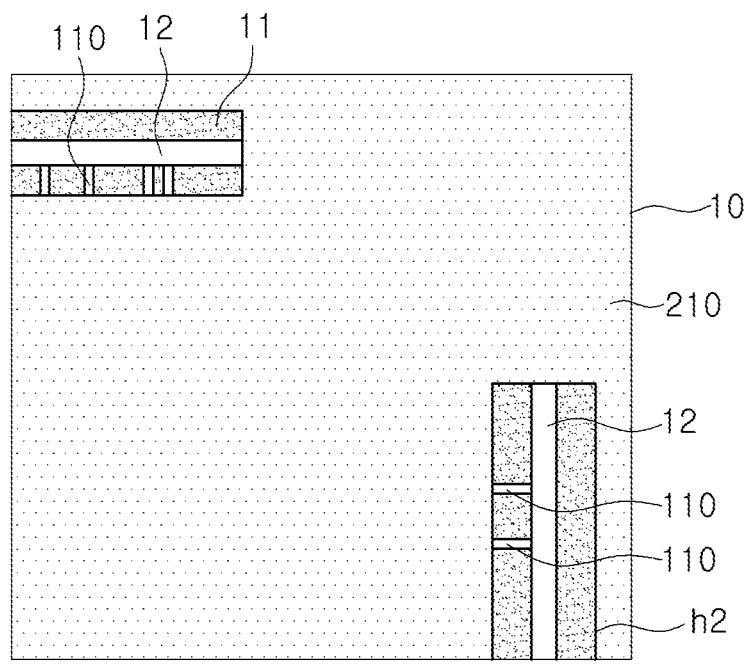
FIG. 11 is a plan view of a structure in which a mask is applied to another partial region of the strip substrate of FIG. 10.
Figure 12:
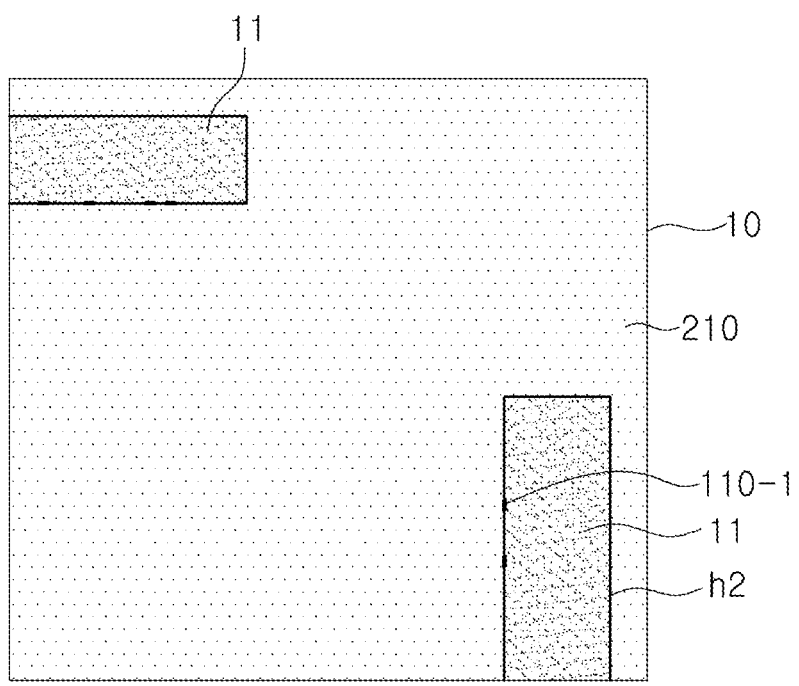
FIG. 12 is a plan view of a structure in which the exposed metal layer of FIG. 11 is removed.

FIG. 11 is a plan view of a structure in which a mask is applied to another partial region of the strip substrate of FIG. 10, and FIG. 12 is a plan view of a structure in which the exposed metal layer of FIG. 11 is removed.

Referring to FIG. 11, a mask 210 is again applied entirely to the one surface 11 of the base substrate 10.

However, in this case, except for a second opening h2, a mask 210 is applied entirely to one surface 11 of the base substrate 10. Thereafter, as disclosed in FIG. 12, a region of the first lead-in line 110 and the outer wiring 12 exposed through the second opening h2 may be removed by etching. The etching may be an etchback etching, and through this etching, only a region covered with the solder resist layer 200 of the first lead-in line 110 remains on the unit region U, and the region exposed through the second opening h2 is removed by etching. Accordingly, as the region of the first lead-in line 110 exposed through the second opening h2 is removed, a first cut surface 110-1 is formed in the region covered with the remaining solder resist layer 200.

The first cut surface 110-1 may be formed to be coplanar with the side surface of the solder resist layer 200 due to a structure thereof, and may be formed in a position spaced apart by a predetermined distance toward the inside from the outer periphery of the unit region U among the one surface 11 of the base substrate 10.

Figure 13:
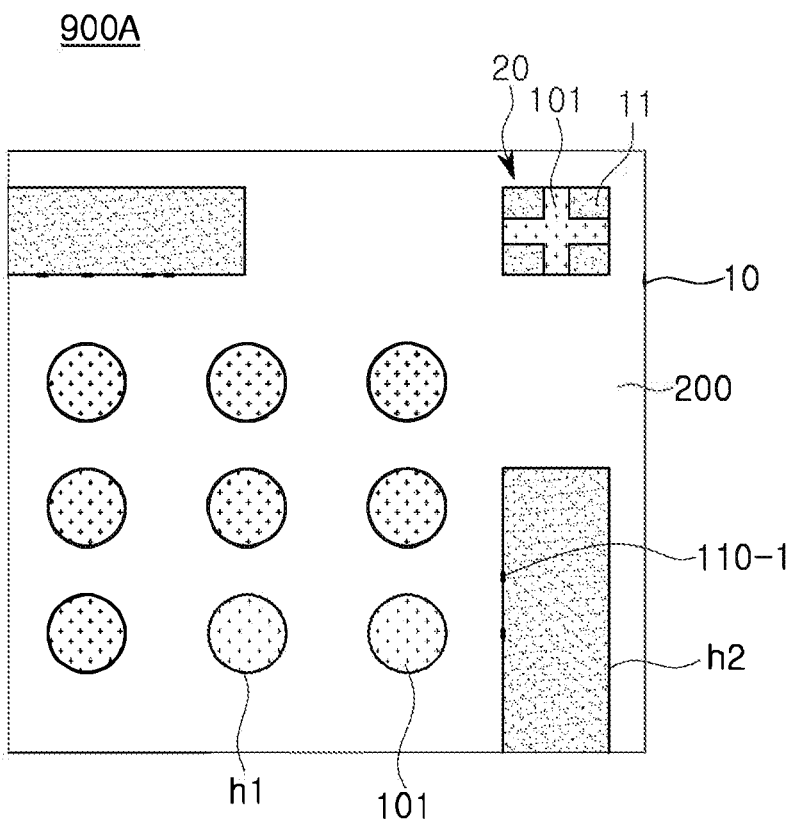
FIG. 13 is a plan view in which the mask of FIG. 12 is removed.
Figure 14:
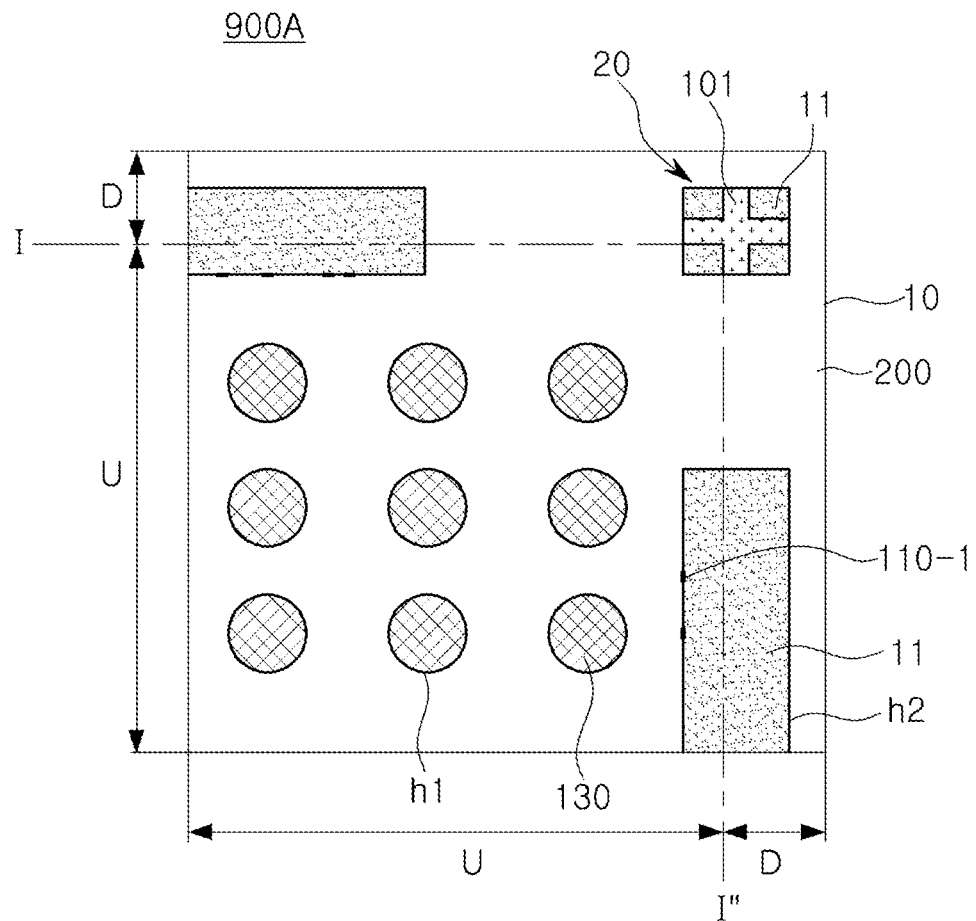
FIG. 14 is a plan view of a structure in which a solder ball is disposed above the connection pad of FIG. 13.

FIG. 13 is a plan view showing a structure in which the mask of FIG. 12 is removed, and FIG. 14 is a plan view showing a structure in which a solder ball is disposed on the connection pad of FIG. 13.

As disclosed in FIG. 13, a mask 210 is removed, and a base substrate 10 is exposed through the second opening h2. Thereafter, as shown in FIG. 14, a solder ball 130 may be disposed on an upper surface of the connection pad 100 on which the gold plating layer 101 exposed through the first opening h1 is disposed.

The solder ball 130 may include a metal material, and any metal material having excellent electrical conductivity is not particularly limited thereto. As the metal material, copper (Cu), aluminum (Al), silver (Ag), tin (Sn), gold (Au), nickel (Ni), lead (Pb), titanium (Ti), or alloys thereof may be included. The solder ball 130 may function as a connection passage for connection between the printed circuit board of the final structure and other electronic components on an upper portion of the base substrate 10.

As described above, one end of the second lead-in line 120 is in contact with the connection pad 100 below the solder ball 130 disposed at the shortest distance from each corner of the unit region U, and the opposite end is connected to an outer wiring 12, and the outer wiring 12 is disposed to intersect at a position adjacent to the corner of the unit region U among the dummy regions D, thereby forming a fiducial mark 20 to be described later. In this way, the outer wiring 12 of the fiducial mark 20 and the connection pad 100 disposed at the shortest distance from each corner of the unit region U are electrically connected, so that an occurrence of a potential difference between the fiducial mark 20 and the solder ball 130 disposed above the connection pad 100 is suppressed. Accordingly, the printed circuit board according to the present disclosure can achieve an effect of preventing a solder ball-shift phenomenon, previously a problem due to the occurrence of a potential difference.

Figure 15:
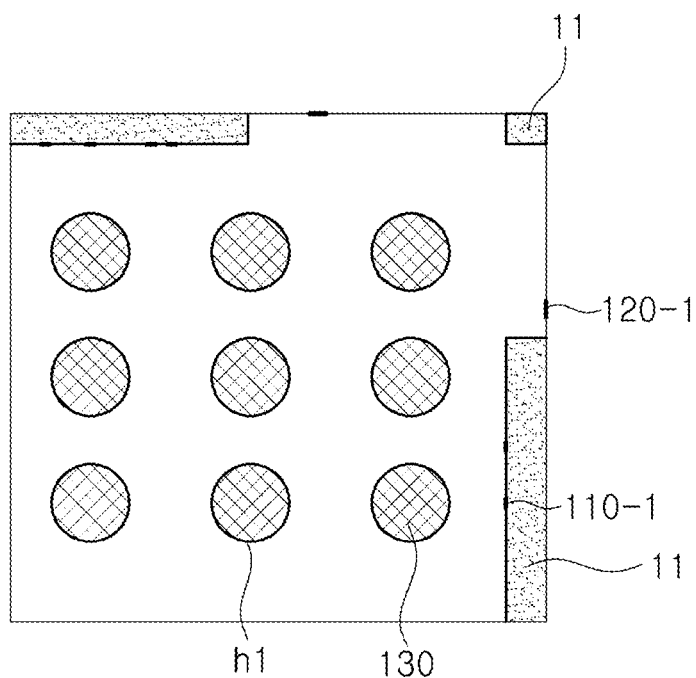
FIG. 15 is a plan view taken along line I-I' of the printed circuit board according to a first embodiment by cutting the strip substrate of FIG. 14.
Figure 16:
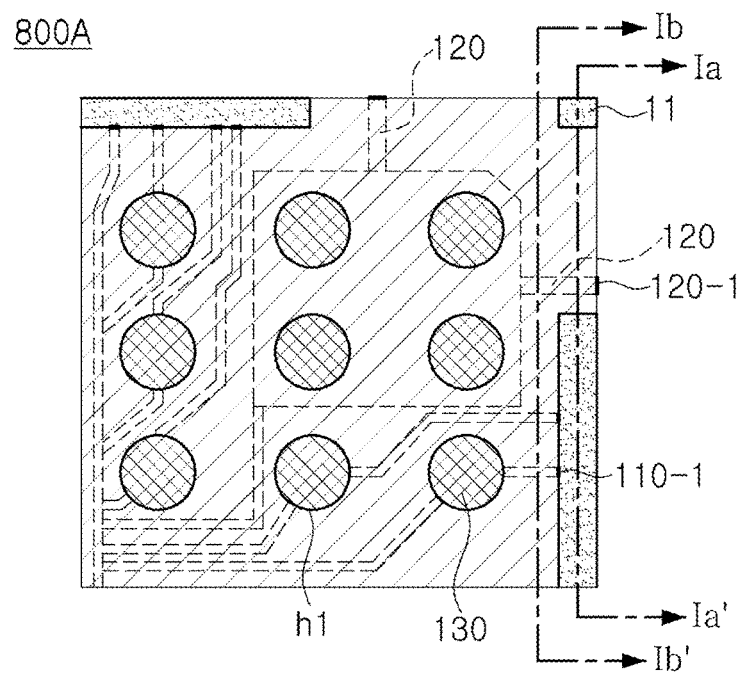
FIG. 16 is a transmittance view through an interior of the printed circuit board of FIG. 15.

FIG. 15 is a plan view taken along line I-I" of the printed circuit board according to a first embodiment by cutting the strip substrate of FIG. 14, and FIG. 16 is a transmittance view through the inside of the printed circuit board of FIG. 15.

As shown in FIG. 15, in a structure in which the unit region U and the dummy region D are separated, the second lead-in line 120 and the connection pad 100 disposed at the shortest distance from the corner of one surface 11 of the remaining base substrate 10 are electrically connected, so that an occurrence of a potential difference between the fiducial mark 20 and the solder balls 130 disposed above the connection pad 100 may be suppressed. Accordingly, the printed circuit board according to the present disclosure can achieve an effect of preventing a solder ball shift phenomenon, which was previously a problem due to the occurrence of a potential difference.

FIG. 15 is a plan view of the printed circuit board 800A obtained by dicing the reference mark 20 as a reference and dividing the unit region U in the base substrate 10 from the dummy region D. In this case, due to the removed solder resist layer 200, one surface 11 of the base substrate 10 has a step due to a difference in height between the one surface 11 and the solder resist layer 200 in an outer peripheral portion, and the step may be formed to have the same thickness as the thickness of the solder resist layer 200.

The step may have a region formed by cutting the second opening h2 and a region formed by cutting the fiducial mark 20 in a dicing process. The step formed by cutting the second opening h2 may be formed on an outer peripheral portion of one surface 11 of the base substrate 10, and the step formed when the fiducial mark 20 is cut in the dicing process may be formed at each corner of the one surface 11 of the base substrate 10. This may be formed in the same manner at three corners of the unit region U, other than the corner illustrated in FIG. 15.

Through the dicing process, a partial region of the second lead-in line 120 covered with the solder resist layer 200 may be cut, and a specific structure thereof is disclosed in FIG. 16.

FIG. 16 is a transmittance view viewed through the solder resist layer 200 of the printed circuit board 800A of FIG. 15, and as described above, the first lead-in line 110 is etched back etched in an etching process, and has a first cut surface 110-1 in a position spaced apart from an outer periphery of the unit region U by a predetermined distance.

Meanwhile, the second lead-in line 120 may be cut by dicing or sawing in a region in contact with the outer wiring 12 or an interface between the unit region U in the above-described dicing process. A second cut surface 120-1 may be formed on a side surface of the second lead-in line 120 of the cut surface, and since the second cut surface 120-1 is formed along an outer periphery of one surface 11 of the base substrate 10, the second cut surface 120-1 may remain after cutting and be coplanar with the side surface of the base substrate 10 disposed therebelow. In addition, it may also be coplanar with the solder resist layer 200 remaining thereabove after dicing. In this case, referring to FIG. 16, the side surface of the printed circuit board 800A and another side surface of the printed circuit board 800A intersect at the corner of the base substrate 10.

As a result, as shown in FIG. 16, when viewed from above, the first lead-in line 110 and the second lead-in line 120 may be formed to have different spaced distances from an outer peripheral portion of one surface 11 of the base substrate 10 on the one surface 11. In other words, the first cut surface 110-1 of the first lead-in line 110 may be disposed to be spaced by a predetermined distance from the outer peripheral portion of the one surface 11 of the base substrate 10, that is, the side surface of the base substrate 10, but the second cut surface 120-1 of the second lead-in line 120 may be disposed on the outer peripheral portion of one surface 11 of the base substrate 10, to be coplanar with the side surface of the base substrate 10.

Figure 17:
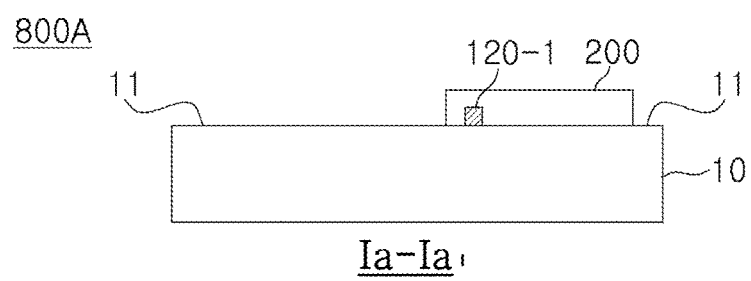
FIG. 17 is a cross-sectional view along line Ia-Ia' of the printed circuit board according to the first embodiment of FIG. 16.

Meanwhile, FIG. 17 is a cross-sectional view along line Ia-Ia' of the printed circuit board according to the first embodiment of FIG. 16.

Figure 18:
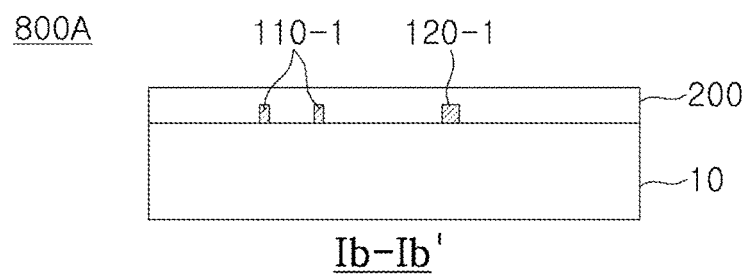
FIG. 18 is a cross-sectional view along line Ib-Ib' of the printed circuit board according to the first embodiment of FIG. 16.
Figure 19:
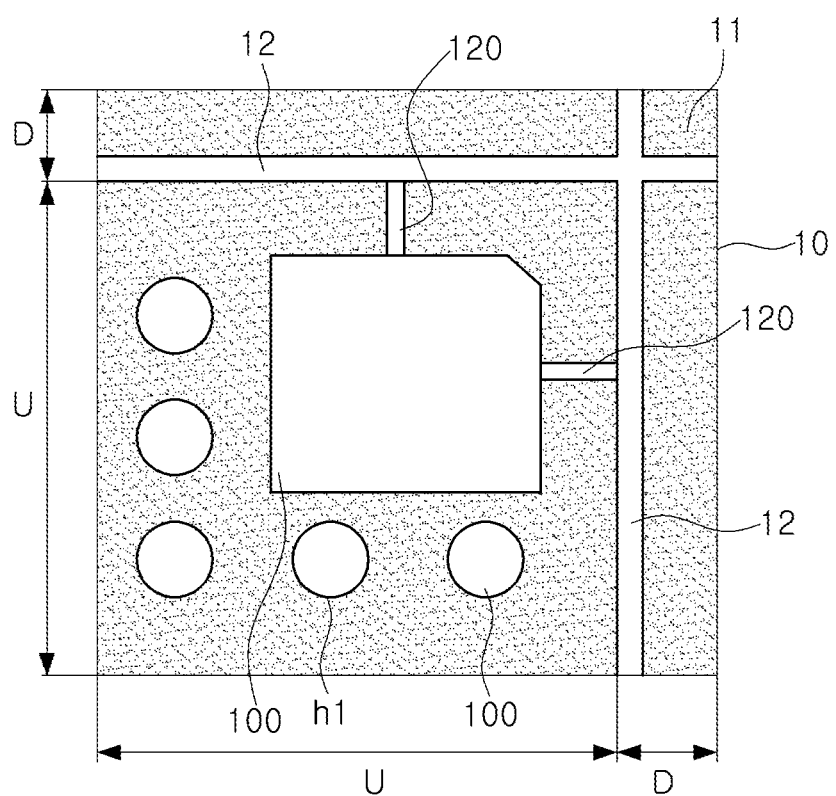
FIG. 19 is an enlarged view of region A showing the structure of a strip substrate according to a second embodiment of the present disclosure, compared to FIG. 4.

In addition, FIG. 18 is a cross-sectional view along line Ib-Ib' of the printed circuit board according to the first embodiment of FIG. 16; FIG. 19 is an enlarged view of region A showing a structure of a strip substrate according to a second embodiment of the present disclosure, compared to FIG. 4.

Compared to the first embodiment disclosed in FIG. 4, a strip substrate 900B of FIG. 19 includes a base substrate 10 like the strip substrate 900A, and a configuration of the first lead-in line is not disclosed. Accordingly, it has a structure in which only the second lead-in line 120 in contact with the connection pad 100 disposed at the shortest distance from each corner of the unit region U is disposed on one surface 11 of the base substrate 10.

Other details are substantially the same as those of the strip substrate 900A according to the first embodiment described above, and detailed descriptions of overlapping contents will be omitted.

Figure 20:
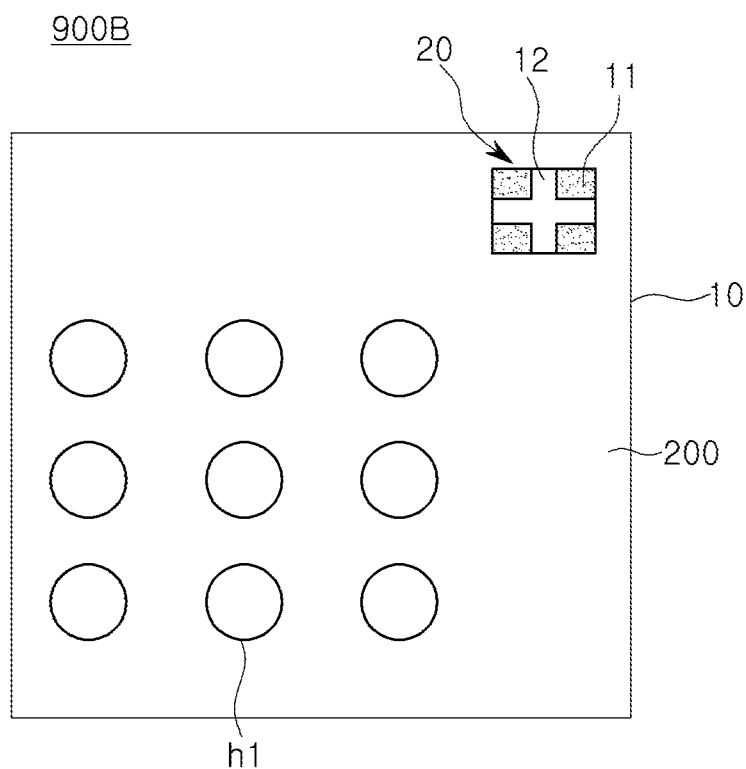
FIG. 20 is a plan view of a structure in which a solder resist layer is applied to the strip substrate of FIG. 19 and an opening and a fiducial mark are formed.

FIG. 20 is a plan view of a structure in which a solder resist layer is applied to the strip substrate of FIG. 19 and an opening and a fiducial mark are formed.

According to FIG. 20, a plan view of a structure in which a solder resist layer 200 is applied on the strip substrate 900B of FIG. 19, and a fiducial mark 20 and an opening h1 exposing the connection pad 100 are formed in the same manner as the strip substrate 900A according to the first embodiment is shown.

Figure 21:
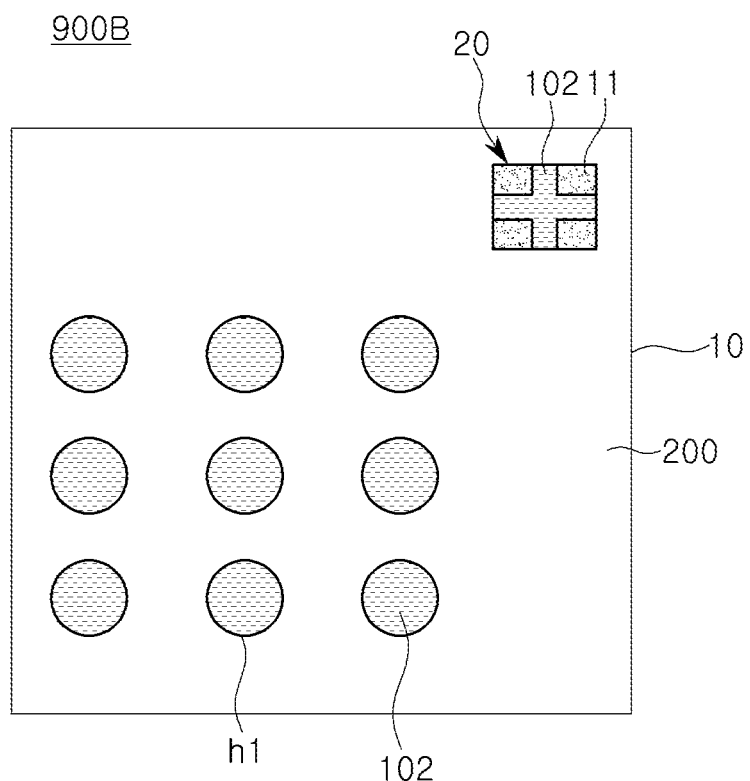
FIG. 21 is a plan view of a structure in which a surface treatment is performed on the strip substrate of FIG. 20.

FIG. 21 is a plan view of a structure of the strip substrate of FIG. 20 subjected to surface treatment.

FIG. 21 is a plan view of a structure in which a surface treatment process is performed on the connection pad 100 and the outer wiring 12 on the first opening h1 and the fiducial mark 20 of FIG. 20. Through the surface treatment, a surface treatment layer 102 may be disposed on an upper surface of the connection pad 100 exposed through the first opening h1 and above the outer wiring 12 inside the fiducial mark 20. The surface treatment layer 102 may be formed by methods of organic solderability preservative (OSP), hot air solder level (HASL), electroless nickel/immersion gold (ENIG), and electroless nickel/electroless palladium/immersion gold (ENEPIG). In addition, as the surface treatment layer 102, an electroless plating layer may be formed.

In the case of the strip substrate 900A according to a first embodiment, a configuration of the first lead-in line 110 for electroplating was required, and electroplating was performed through the electrical connection of the first lead-in line 110. On the other hand, in the case of the strip substrate 900B of FIG. 21, since an electroplating process is not started, the first lead-in line 110 is not separately disposed, and an electroless plating process that can be performed without a plating lead-in line may be performed. An electroless plating layer 102 formed by performing an electroless plating treatment may include metal such as copper (Cu), silver (Ag), palladium (Pd), aluminum (Al), nickel (Ni), titanium (Ti), gold (Au), platinum (Pt) or alloys thereof.

As described above, in the case of the strip substrate 900B according to a second embodiment, an electroplating process is not performed, and a surface treatment layer 102 due to electroless plating or surface treatment may be disposed above the connection pad 100 and the outer wiring 12 inside the fiducial mark 20.

Figure 22:
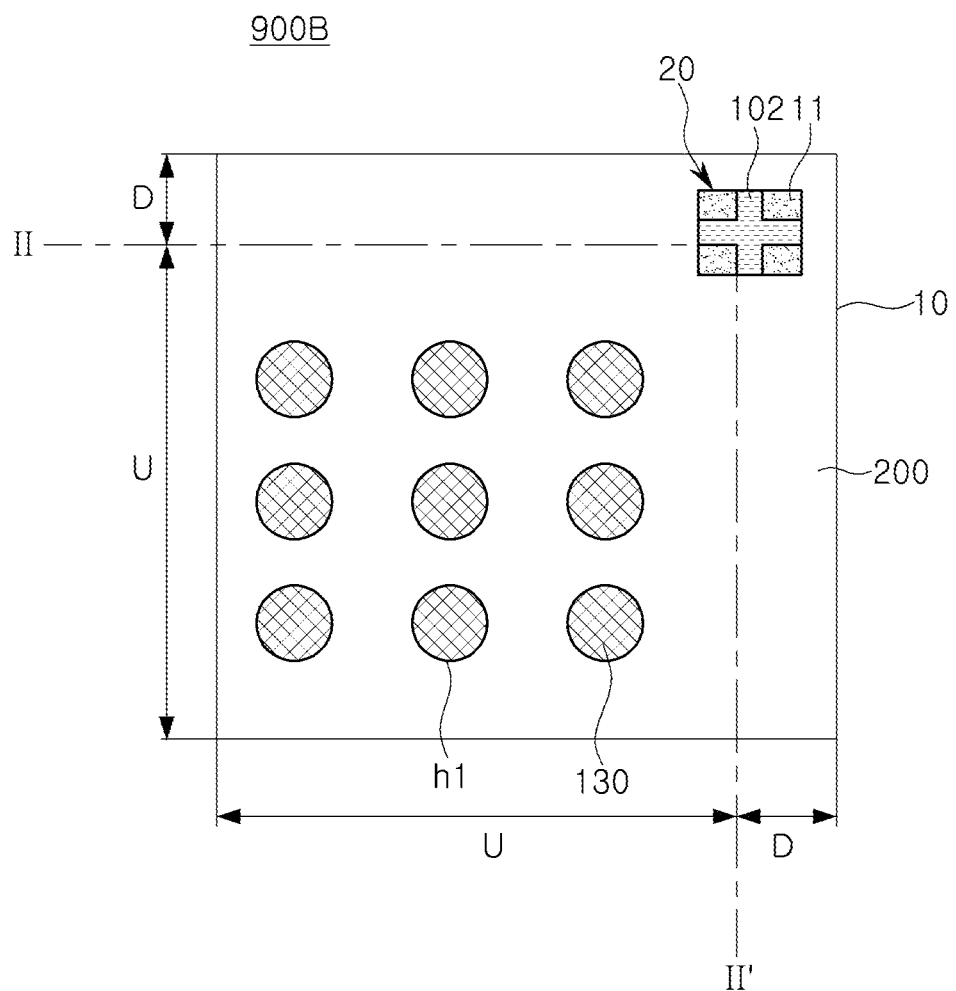
FIG. 22 is a plan view of a structure in which solder balls are disposed above the connection pad of FIG. 21.

FIG. 22 is a plan view of a structure in which solder balls are disposed above the connection pad of FIG. 21.

A solder ball 130 may include a metal material, and any metal material having excellent electrical conductivity is not particularly limited. As the metal material, copper (Cu), aluminum (Al), silver (Ag), tin (Sn), gold (Au), nickel (Ni), lead (Pb), titanium (Ti), or alloys thereof may be included. The solder ball 130 may function as a connection path for connection between the printed circuit board of a final structure and other electronic components thereabove.

In a strip substrate 900B according to a second embodiment, a solder ball 130 disposed on the connection pad 100 disposed at the shortest distance from each corner of a unit region U may be connected through a fiducial mark 20 and a second lead-in line 120, and accordingly, a potential difference may not occur between the fiducial mark 20 and the solder ball 130 disposed on the connection pad 100 disposed at the shortest distance from each corner of the unit region U, so as to have an effect capable of preventing a solder ball-shift phenomenon.

Other details are substantially the same as those of the first embodiment, and detailed descriptions of overlapping details will be omitted.

Figure 23:
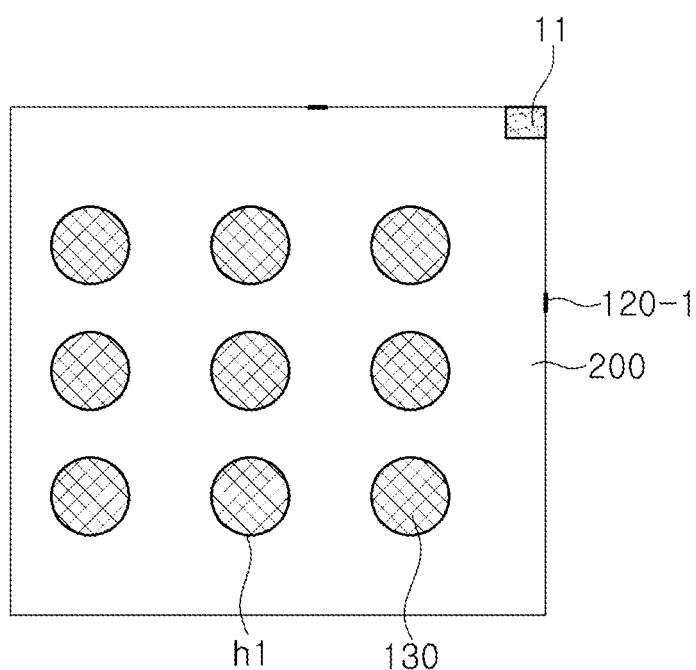
FIG. 23 is a plan view taken along line II-II' of the printed circuit board according to a second embodiment by cutting the strip substrate of FIG. 22.
Figure 24:
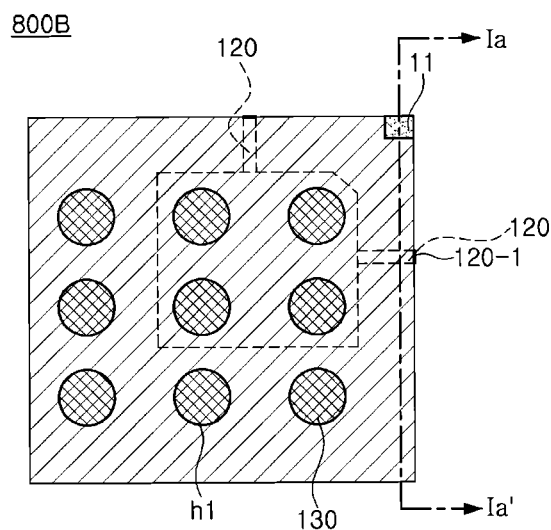
FIG. 24 is a transmittance view through an inside of the printed circuit board of FIG. 23.

FIG. 23 is a plan view taken along line II-II" of the printed circuit board according to a second embodiment by cutting the strip substrate of FIG. 22, and FIG. 24 is a transmittance view through an inside of the printed circuit board of FIG. 23.

In a structure in which the unit region U and the dummy region D are separated as shown in FIG. 23, the remaining second lead-in line 120 and the connection pad 100 disposed at the shortest distance from the corner of one surface 11 of the base substrate 10 are electrically connected, such that an occurrence of a potential difference between the fiducial mark 20 and the solder ball 130 disposed above the connection pad 100 is suppressed. Accordingly, the printed circuit board according to the present invention can achieve an effect of preventing a solder ball-shift phenomenon, which was previously a problem due to the occurrence of a potential difference.

FIG. 23 is a plan view of a printed circuit board 800B after dicing or sawing the dummy region D and the unit region U of one surface of the base substrate 10 to be separated. Like the first embodiment, the printed circuit board 800B may also have a step formed in an outer portion of the unit region U. However, unlike the first embodiment, since a second opening h2 is not formed, in the case of the printed circuit board 800B according to the second embodiment, a step may be formed at the corner of one surface 11 of the base substrate 10.

This may be formed in the same manner at three corners of the unit region U other than the corner illustrated in FIG. 23. Since the step is occurs due to a difference in heights between the base substrate 10 and the solder resist layer 200 disposed thereabove, and the thickness of the step may be substantially the same as the thickness of the solder resist layer 200.

Figure 25:
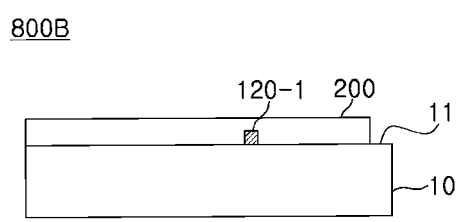
FIG. 25 is a cross-sectional view along line IIa-IIa' of the printed circuit board according to the second embodiment of FIG. 24.

FIG. 24 is a transmittance view of the structure of FIG. 23 and FIG. 25 is a cross-sectional view along line IIa-IIa' of the printed circuit board according to the second embodiment of FIG. 24. As disclosed in FIG. 24, in the printed circuit board 800B according to the second embodiment, the configuration of the first lead-in line 110 is not disclosed, the second lead-in line 120 is disclosed, and a second cut surface 120-1 is formed at the second lead-in line 120, together with dicing. The second cut surface 120-1 may be cut by dicing and coplanar with a side surface of the base substrate of the remaining base substrate 10. Of course, the second cut surface 120-1 may cover an upper portion thereof, and may also be coplanar with a side surface of the solder resist layer 200 cut together with by dicing. In this case, referring to FIG. 24, the side surface of the printed circuit board 800B and another side surface of the printed circuit board 800B intersect at the corner of the base substrate 10.

Figure 26:
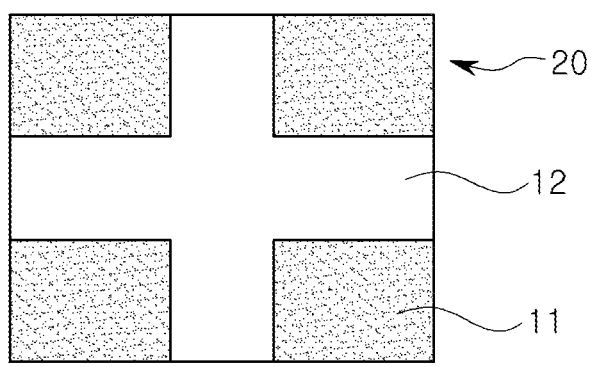
FIG. 26 is a plan view showing in detail of the structure of the fiducial mark of the present disclosure.

FIG. 26 is a plan view showing in detail a structure of the fiducial mark of the present disclosure.

FIG. 26 is a plan view showing an enlarged region of a fiducial mark 20, and the fiducial mark 20 includes a base substrate 10 and an outer wiring 12. The outer wiring 12 crosses in a cross shape, functions as a metal layer recognizing the fiducial mark 20, and may be exposed through a solder resist layer 200 to facilitate recognition of the fiducial mark 20. During a dicing or sawing process of the strip substrate, the fiducial mark 20 functions as a marking region that presents a reference point to dicing or sawing the exact unit region U, and is easily recognized by a dicing equipment due to the plating layer thereabove.

Other details are substantially the same as those of the first embodiment, and detailed descriptions of overlapping details will be omitted.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of the various effects of the present disclosure, a printed circuit board capable of preventing the occurrence of static electricity by suppressing the occurrence of a potential difference between a unit substrate and a dummy region may be provided.

As another effect of the various effects of the present disclosure, a printed circuit board that facilitates a connection between solder balls and an inspection of product characteristics may be provided in a strip unit substrate during a manufacturing process of a substrate may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
   a base substrate;
   a plurality of connection pads disposed on one surface of the base substrate, the one surface being surrounded by an outer edge thereof; and
   first and second lead-in lines disposed on the one surface and respectively connected to at least a portion of the plurality of connection pads,
   wherein the first and second lead-in lines have first and second cut surfaces on the one surface, respectively,
   wherein the first cut surface is disposed in a position spaced apart from the outer edge of the one surface, and
   wherein the second cut surface is exposed to a side surface of the printed circuit board adjacent the outer edge of the one surface.

2. The printed circuit board of claim 1, wherein the second cut surface is coplanar with a side surface of the base substrate.

3. The printed circuit board of claim 1, further comprising a solder resist layer disposed on the plurality of connection pads, and having an opening exposing at least a portion of the plurality of connection pads.

4. The printed circuit board of claim 3, further comprising a solder ball disposed on the opening.

5. The printed circuit board of claim 3, wherein a step is provided in at least one region of an outer portion of the one surface of the base substrate.

6. The printed circuit board of claim 3, wherein a step is provided at the each corner of the one surface of the base substrate.

7. The printed circuit board of claim 1, wherein the second lead-in line is in contact with a connection pad among the plurality of connection pads.

8. The printed circuit board of claim 7, wherein the second lead-in line is in contact with the connection pad disposed at a shortest distance from a corner of the one surface of the base substrate among the plurality of connection pads.

9. The printed circuit board of claim 7, wherein the connection pad disposed at the shortest distance from the one corner of the one surface of the base substrate is in contact with a plurality of second lead-in lines.

10. The printed circuit board of claim 1, further comprising an electroless plating layer disposed on a surface of at least a portion of the plurality of connection pads.

11. The printed circuit board of claim 10, further comprising a gold plating layer disposed on at least a portion of a surface of the plurality of connection pads, in contact with the first lead-in line among the plurality of connection pads.

12. The printed circuit board of claim 1, wherein each of the first and second lead-in lines is a conductive pattern.

13. The printed circuit board of claim 1, further comprising:
    a solder resist layer having first openings exposing the plurality of connection pads, and a second opening disposed at a corner of the base substrate,
    wherein the side surface of the printed circuit board and another side surface of the printed circuit board intersect at the corner of the base substrate.

14. A printed circuit board, comprising:
    a base substrate;
    a plurality of connection pads disposed on one surface of the base substrate, the one surface being surrounded by an outer edge thereof;
    a first lead-in line disposed on the one surface of the base substrate having a first cut surface disposed in a position spaced apart from the outer edge of the one surface; and
    a second lead-in line disposed on the one surface of the base substrate having a second cut surface exposed from a side surface of the base substrate adjacent the outer edge of the one surface,
    wherein a connection pad disposed at a shortest distance from a corner of the one surface of the base substrate among the plurality of connection pads is connected to the second lead-in line.

15. The printed circuit board of claim 14, wherein the second cut surface is coplanar with the side surface of the base substrate.

16. The printed circuit board of claim 14, wherein a connection pad connected to the second lead-in line among the plurality of connection pads is connected to a plurality of lead-in lines.

17. The printed circuit board of claim 14, further comprising a solder resist layer disposed on the one surface of the base substrate, and having an opening exposing at least a portion of the plurality of connection pads, and
    a solder ball disposed in at least a portion of the opening.

18. The printed circuit board of claim 17, wherein a step is provided in at least a portion of a corner of the one surface of the base substrate.

19. The printed circuit board of claim 14, further comprising a surface treatment layer disposed on at least a portion of surfaces of the plurality of connection pads.

20. The printed circuit board of claim 14, further comprising:
    a solder resist layer having first openings exposing the plurality of connection pads, and a second opening disposed at the corner of the base substrate,
    wherein a side surface of the printed circuit board and another side surface of the printed circuit board intersect at the corner of the base substrate.

* * * * *